United States Patent
Lu et al.

(10) Patent No.: US 6,777,251 B2
(45) Date of Patent: Aug. 17, 2004

(54) METROLOGY FOR MONITORING A RAPID THERMAL ANNEALING PROCESS

(75) Inventors: Ching Shan Lu, Tainan (TW); Fu-Su Lee, Tainan (TW); Wei-Ming You, Taipei (TW); Jih-Churng Twu, Chung-Ho (TW); Yu-Chien Hsiao, Peitou (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 52 days.

(21) Appl. No.: 10/175,702

(22) Filed: Jun. 20, 2002

(65) Prior Publication Data

US 2003/0235928 A1 Dec. 25, 2003

(51) Int. Cl.⁷ .............................................. H01L 21/66
(52) U.S. Cl. ............................ 438/14; 438/15; 324/765
(58) Field of Search ........................... 324/765; 438/14, 438/15

(56) References Cited

U.S. PATENT DOCUMENTS

| | | | | |
|---|---|---|---|---|
| 5,882,947 A | * | 3/1999 | Lin et al. ..................... 438/14 |
| 6,015,997 A | * | 1/2000 | Hu et al. ..................... 257/412 |
| 6,049,220 A | * | 4/2000 | Borden et al. ............... 324/765 |
| 6,107,108 A | * | 8/2000 | Chen et al. .................... 438/14 |
| 6,128,084 A | * | 10/2000 | Nanbu et al. ................ 356/369 |
| 6,262,458 B1 | * | 7/2001 | Hu ............................... 257/384 |
| 6,426,644 B1 | * | 7/2002 | Borden et al. ............... 324/765 |
| 6,436,818 B1 | * | 8/2002 | Hu et al. ..................... 438/656 |
| 6,444,579 B1 | * | 9/2002 | Hu ............................... 438/683 |
| 6,445,045 B2 | * | 9/2002 | Hu ............................... 257/384 |
| 6,483,594 B2 | * | 11/2002 | Borden et al. ............... 356/502 |

* cited by examiner

Primary Examiner—John F. Niebling
Assistant Examiner—Olivia T. Luk
(74) Attorney, Agent, or Firm—Tung & Associates

(57) ABSTRACT

A method including operating an ion implanted to implanting ions in a semiconductor wafer at a first ion dose level; performing a first thermal wave measurement to obtain the first thermal wave value; placing the semiconductor wafer in a rapid thermal annealing furnace and operating the furnace to rapidly heat the semiconductor wafer at a first rate for a first time period and so that the wafer is heated with intent of achieving a wafer temperature of 500° C.; performing a second thermal wave measurement to obtain a second thermal wave value; comparing the difference between the first thermal wave value and the second thermal wave value to a target range of 376.5–382.5 and rejecting the wafer as being outside of an acceptable specification if the difference is outside of the target range.

17 Claims, 1 Drawing Sheet

METROLOGY FOR MONITORING A RAPID THERMAL ANNEALING PROCESS

FIELD OF THE INVENTION

This invention relates to semiconductor meteorology, and more particularly to a new meteorology for monitoring a rapid thermal annealing process.

BACKGROUND OF THE INVENTION

One of the most important properties of semiconductor materials is that the semiconductor material conductivity can be controlled by adding dopants. Semiconductor materials such as silicon (Si), germanium (Ge), and gallium-arsenate (GaAs) are doped with either n-type or p-type dopants in typical integrated circuit fabrication processes. Heretofore, diffusion and ion implantation have been the two primary methods used to doped semiconductors. However, in modern integrated circuit fabrication processes, doping is mainly accomplished by ion implantation.

Pure single-crystal silicon has a high resistivity, and the more pure the crystal, the higher the resistivity. The conductivity of single-crystal silicon can be improved by adding dopants, such as boron (B), phosphorus (P), arsenic (As) or antimony (Sb). Boron is a p-type dopants with only three electrons in the outer valence shell or orbit. A boron atom provides a hole by replacing a silicon atom (that has four electrons in the outer valence shell) in the single-crystal silicon lattice. Holes can carry electrical current which acts as a positive charge. Semiconductor devices doped with boron are called p-type semiconductors. Phosphorus, arsenic and antimony atoms have five electrons in the outer valence shell so they can provide electrons to conductive electrical current when they replace a silicon atom in the single-crystal silicon wafer. Because the electron has a negative charge, phosphorus, arsenic and antimony are called n-type dopants, and the semiconductors with these dopants are called n-type semiconductors.

Traditionally, doping was accomplished using a diffusion process in high-temperature furnaces. The area where the furnaces were located was called the diffusion bay, and the furnaces were called diffusion furnaces, even though the furnaces have been used for diffusion or other processes such as oxidation or annealing. Currently, few diffusion doping processes are performed in advance integrated circuit manufacturing facilities, and the furnaces have been used mainly for oxidation and annealing. However, the furnace area in most integrated circuit fabrication facilities is still called the diffusion bay and the furnaces are still called diffusion furnaces.

The diffusion process usually involves multiple steps. A dopant oxide layer is normally deposited on the wafer surface in a predeposition process. Thereafter, an oxidation process converts the dopant oxide into silicon dioxide and forms a high concentration of dopant in the silicon substrate near the silicon-silicon dioxide interface. A high-temperature drive-in process diffuses the dopant atoms into the substrate to the depth required for desired devices. The three processes: predeposition; oxidation; and drive-in; are high temperature processes usually taking place in furnaces. After the dopant drive in, the oxide layer is stripped by a wet etching process.

However, the diffusion process has a number of limitations. The dopant concentration and junction depth cannot be independently controlled, because both are strongly related to the diffusion temperature. Another major disadvantage is that the dopant profile is always isotropic due to the nature of the diffusion process. Consequently, an alternative and better process was being sought of those working in the art.

An ion implantation process provides for much better control of doping than the diffusion process. Ion implantation adds dopant atoms into the silicon wafer using energetic ion beam injection. Contrary to the diffusion process, ion implementation can independently control both dopant concentration and junction depth. The dopant concentration can be controlled by the combination of ion beem current and implantation time, and the junction depth can be controlled ion energy. The ion implantation process can dope the silicon with a wide range of doping concentrations ranging from $10^{11}$ to $10^{17}$ atoms/cm$^2$. Although the diffusion process requires a thick oxide to be grown as the diffusion mask, ion implantation is a room temperature process, and a thick layer of photoresist can block the energetic dopant ions. Ion implantation can use photoresist as the patterning mask and does not need to grow silicon dioxide to form a hard mask as was required by the diffusion process. However, the wafer holder of an ion implanter must have a cooling system to take away the heat generated by the energetic ions and to prevent photoresist reticulation.

A mass analyzer of an ion implanter selects exactly the correct ion species needed for ion implantation and generates a pure ion beam thus eliminating the possibility of contamination. The ion implantation process is operated in a high vacuum, clean environment, and is anisotropic. Dopant ions are implanted into silicon primarily in a vertical direction, and the doped region clearly reflects the area identified by the photoresist mask. This is in contrast to the diffusion process which is isotropic and wherein the dopant always diffuses laterally underneath the silicon dioxide mask.

When ions bombard and penetrate the silicon substrate, they collide with lattice atoms. The ions generally lose their energy and eventually stop inside the silicon. There are two stopping mechanisms that are known. One is when the implanted ions collide with nuclei from the lattice atoms, are scattered significantly by collision, and transfer energy to the lattice atoms. This is called the nuclear stopping. In this hard collision, lattice atoms may receive enough impact energy to break free from the lattice binding energy which causes crystal structure disorder and damage. Another stop mechanism is when incidental ions collide with electrons of the lattice atoms. The incidental ion path in the electronic collision is almost unchanged, energy transferred is very small, and crystal structure damage is minimal. This soft collision is called electronic stopping.

The ion energy of the ion implantation process range from also low energy of 0.5 keV for ultra-shallow junctions to high-energy of 1 MeV for well implantation. In general, the higher the ion energy the deeper the ion can penetrate into the substrate. However, even with the same implantation energy, ions don not stop exactly at the same depth in the substrate because the ions each have different collisions with different atoms. The projected ion penetration range always has a distribution.

Higher energy ion beams can penetrate deeper into the substrate, and therefore have a longer projected ion penetration range. Since smaller ions have smaller collision cross-sections, smaller ions at the same energy level can penetrate deeper into the substrate and the mask materials.

The projected penetration range of an ion in an amorphous material always follows a Gaussian distribution, also called the normal distribution. In a single-crystal silicon, the lattice atoms have an orderly arrangement, and many channels can be seen at different angles. If an ion enters the silicon at the right angle, it can travel long distance with very little energy if it enters the channel. This is called channeling effect. The channeling effect causes some ions to penetrate deeply into the single-crystal substrate. This can form a "tail" on the normal dopant distribution curve. It is an undesirable dopant profile which could affect the electronic device performance. Therefore, several methods have been used to minimize this effect.

One way to minimize the channeling effect is ion implantation on a tilted wafer, which typically is tilted an angle ranging from 0–7 degrees. When a tilted wafer is used, ions impact the wafer at an angle and cannot reach the channel. The incident ions have nuclear collisions right away, and effectively reduce the channeling effect. Most ion implantation processes use this technique to minimize channeling effect and most wafer holders used with an ion implanter have the capability of adjusting the tilt angle of the wafer.

Tilting the wafer may cause shadowing effects by the photoresist which can be solved by rotating the wafer and/or a small amount of dopant diffusion during post-implantation annealing. However, if the tilt angle is too small, sometimes the dopant concentration in the silicon can form a hump distribution due to the channeling effect.

Another widely used method to deal with the channeling problem is ion implantation through a thin layer of screen silicon dioxide. Thermally grown silicon dioxide is an amorphous material. Implanted ions passing through the silicon dioxide scattering silicon and oxygen atoms in the screen layer before they enter the single-crystal silicon substrate. Because of the collisional scattering, the pitch angle of ions to the silicon crystal will distribute in a wide range reducing the chance of channeling. The screen oxide also can prevent the silicon substrate from being contaminated by the photoresist. In some cases both screen oxide and wafer tilting are used to minimize the channeling effect.

However, a recoil effect can be produced using screen oxide. Recoiling oxygen atoms can be implanted into the silicon substrate, forming a high oxygen concentration region in the silicon substrate near the silicon-oxide interface which will degrade the carrier mobility and introduce deep level traps.

As indicated earlier, in an ion implantation process, ions generally lose their energy by collecting with lattice atoms and transfer their energy to these atoms. The transferred energy is high enough for these atoms to break free from the lattice binding energy. These free atoms also collide with other lattice atoms or traveling inside the substrate and thus knocking them free from the lattice. The process continues until enough free atoms have lost enough energy. One energetic ion can cause thousands of displacement of lattice atoms. The damage created by one ion can be quickly self annealed by thermal movement of atoms inside the substrate at room temperature. However, in an ion implantation process, the number of ions is so large that the self annealing process cannot repair the crystal damage in a short time. The amount of damage is related to the dose, energy, and mass of the ion species and increases when the dose and ion energy increases. When the ion implantation dose is high enough, the substrate crystal structure can be completely destroyed becoming amorphous near the substrate surface.

This damage must be repaired to restore the single-crystal structure and activate the dopant. Only when the dopant atoms are in the single-crystal lattices can they effectively provide electrons or holes as the major carriers for electric current. When subjected to a high temperature process, the atoms get energy from heat and start rapid thermal motion. The atoms find the sites with the lowest free energy, which are located at single-crystal lattices. Because the substrate underneath the damage is single-crystal silicon, the silicon and dopant atoms in the damaged amorphous layer reconstruct the single crystal structure thereby falling into the lattice grids.

The single crystal annealing, dopant atom activation, and dopant diffusion all happen simultaneously during a high temperature process. As the size of integrated circuit features continue to shrink, there is less and less room for the dopant atoms to diffuse, thus minimizing the dopant diffusion during the thermal annealing becomes very important. The dopants in the amorphous silicon must the capable of free thermal movement without any restrictions so that they can diffuse much faster than they can in single-crystal lattices which has a binding energy that severely restrict the movement of the dopant atoms. At low temperatures, the diffusion process outpaces the annealing process. However, at temperatures near or above 1000° C. the annealing process is faster than the diffusion process.

Some annealing processes are conducted at a temperature ranging from about 850–1000° C. for about 30 minutes. Because the annealing process takes a substantially longtime, dopant atoms diffusion can be quite substantial and therefore is not acceptable for submicron devices.

Rapid thermal annealing is a process developed to anneal implantation caused damage while minimizing dopant diffusion to meet the requirements of smaller and smaller semiconductor devices. The rapid thermal annealing process is typically a single wafer system with temperature ramp up to 250° C./second. The rapid thermal annealing process can operate up to 1150° C. and can anneal implantation damages in less than 20 seconds. However, the amount of annealing required is a function of the damage to the wafer. Two common ways to measure wafer damage include measuring the resistivity and the thermal wave value or signal.

Dopant species, junction depth and dopant concentration are the most important factors to control and measure in an ion implantation process. Dopant species can be determined by a mass analyzer of an ion implanter. Dopant concentration is determined by the ion beam current and the implantation time. A four-point probe is the most common measurement tool use in implantation process monitoring. A four-point probe measures sheet resistance of the silicon surface. The sheet resistance ($R_s$) is defined as the resistivity divided by the thickness of the doping junction. The resistivity is mainly determined by dopant concentration and thickness is mainly determined by the doping junction depth. The dopant junction depth is controlled by the dopant ion energy. Consequently, sheet resistance measurement can give information about dopant concentration, since the junction depth can be estimated by knowing the ion energy, ion species, and the substrate materials.

The four point probe is employed to measure sheet resistance by applying a certain amount of current between two pins and measure in the voltage difference between the other two pins from which the sheet resistance can be calculated. The four point probe measurement usually is performed after the annealing process, which is used to make decisions about repairing the damaged crystal structure and activating the dopants. Because the four point probe makes direct contact with the wafer surface, it is primarily used for testing wafers, for process development, qualification and controlling. In operation, the probe must contact the silicon surface with enough force so that the pins break any oxide thereon in order to make direct contact with the silicon substrate.

Another commonly used process monitoring technique is known as the thermal wave system. In the thermal wave system, an argon pump laser generates thermal pulses on the wafer surface, and another helium-neon probe laser measures the DC reflectivity and reflectivity modulation induced by the pump laser at the same spot. The ratio of the DC reflectivity and the reflectivity modulation is called the thermal wave (TW) signal which is related to crystal damage. The crystal damage in turn is a function of the implant dosage. In prior art procedures, the thermal wave measurement is performed immediately after the implant process and prior to the annealing step. This is an advantage over the four point probe, which requires the annealing process to be performed prior to measurement. Another advantage of the thermal wave probe is that it is a non-destructive measurement. Thus, the thermal wave measurement can be applied to production wafers, where as the four point probe is used only for test wafers. One of the disadvantages of the thermal wave measurement is that it has a low sensitivity at low dosages. Another disadvantage is the drift of the thermal wave signal over time caused by room temperature annealing, or ambient annealing. Furthermore, the wafer heating caused by the laser beam during the measurement also accelerates relaxation of the damage, which alters the reflectivity of the substrate. That is, the measurement process disturbs what is supposed to be measured. As a result, the prior art thermal wave measurement techniques lack a high degree of accuracy. The present invention provides alternatives to and advantages over the prior art methods of monitoring the implantation and rapid annealing process.

SUMMARY OF THE INVENTION

One embodiment of the invention is a method including operating an ion implanter to implant ions in a semiconductor wafer at a first ion dose level; performing a first thermal wave measurement to obtain a first thermal wave value; placing the semiconductor wafer in a rapid thermal annealing furnace and operating the furnace to rapidly heat the semiconductor wafer at a first rate for a first time period; and performing a second thermal wave measurement to obtain a second thermal wave value.

Another embodiment of the invention further includes comparing the difference between the first thermal wave value and the second thermal wave value to a target range and if the difference is outside the target range then adjusting the rate at which the semiconductor wafer is heated.

Another embodiment of the invention further includes comparing the difference between the first thermal wave value and the second thermal wave value to a target range having an upper limit and lower limit, and if the difference is greater than the upper limit then decreasing the rate at which the semiconductor wafer is heated, and if the difference is less than the lower limit of the target range then increasing the rate at which the semiconductor wafer is heated.

Another embodiment of the invention further includes comparing the difference between the first thermal wave value and the second thermal wave value to a target range and if the difference is outside the target range then rejecting the semiconductor wafer as being outside of acceptable specifications.

In another embodiment of the invention the target range is 376.5–382.5.

Another embodiment of the invention further includes comparing the difference between the first thermal wave value and the second thermal wave value to a target range and if the difference is outside the target range then adjusting the operation of the furnace to supply more or less heat.

Another embodiment of the invention further includes comparing the difference between the first thermal wave value and the second thermal wave value to a target range having an upper limit and a lower limit, and if the difference is greater than the upper limit then adjusting the operation of the furnace to supply less heat, and the difference is less than the lower limit then adjusting the operation of the furnace to supply more heat.

Another embodiment of the invention further includes comparing the difference between the first thermal wave value and the second thermal wave value to a target range and adjusting the time period that the wafer is heated in response to the comparison results.

Another embodiment of the invention further includes comparing the difference between the first thermal wave value and the second thermal wave value to a target range having an upper limit and a lower limit, and if the difference is greater than the upper limit then reducing the time period that the wafer is heated, and if the difference is less than the lower limit then increasing the time period that the wafer is heated.

Another embodiment of the invention further includes comparing the difference between the first thermal wave value and the second thermal wave value to a target range and adjusting the first ion dose level in response to the comparison results.

In another embodiment of the invention the adjusting of the first ion dose level includes increasing the ion dose level if the difference is less than the lower limit of the target range, and decreasing the dose level if the difference is greater than the upper limit of the target range.

Another embodiment of the invention is a method including operating an ion implanter to implant ions in a semiconductor wafer at a first ion dose level; performing a first thermal wave measurement to obtain a first thermal wave value; placing the semiconductor wafer in a rapid thermal annealing furnace and operating the furnace to rapidly heat the semiconductor wafer at a first rate for a first time period and so that the wafer is heated with the intent of achieving a wafer temperature of 500° C.

Another embodiment of the invention wherein the wafer is heated to an intended temperature of 500° C. further includes comparing the difference between the first thermal wave value and the second thermal wave value to a target range and if the difference is outside the target range then adjusting the operation of the furnace to supply more heat or less heat.

Another embodiment of the invention wherein the wafer is heated to an intended temperature of 500° C. further includes comparing the difference between the first thermal wave value and the second thermal wave value to a target range having an upper limit and a lower limit and if the difference is greater than the upper limit then adjusting the operation of the furnace to supply less heat, and if the difference is less than the lower limit then adjusting the operation of the furnace to supply more heat.

Another embodiment of the invention wherein the wafer is heated to an intended temperature of 500° C. further includes comparing the difference between the first thermal wave value and the second thermal wave value to a target range having an upper limit and a lower limit, and if the difference is greater than the upper limit then reducing the time period that the wafer is heated, and if the difference is less than the lower limit then increasing the time period that the wafer is heated.

Another embodiment of the invention wherein the wafer is heated to an intended temperature of 500° C. further includes comparing the difference between the first thermal wave value and the second thermal wave value to a target range and adjusting the first ion dose level in response to the comparison results.

These and other objects, features and advantages of the present invention will become apparent from the following brief description of the drawings, detailed description of the preferred embodiments, and appended claims and drawings.

DETAILED DESCRIPTION OF THE PREFERRED EMBODIMENTS

According to the present invention a plurality of semiconductor wafers were implanted with P species ions using medium current. A first thermal wave (TW) measurement was performed on each other wafers immediately after the ion implantation, and wherein this first thermal wave measurement is referred to as TW Pre-RTA in the Table I below. Thereafter each of the ion implanted wafers was annealed at one of three temperatures, 470° C., 500° C., 530° C., and a second thermal wave measurement was performed on each of the wafers, and wherein this second thermal wave measurement is referred to as Post-RTA in the Table I below. The difference between the Pre-RTA and the Post-RTA values was recorded as Delta-TW in the Table I below.

TABLE I

| Anneal Temp. | TW Pre-RTA | TW Post-RTA | Delta-TW |
| --- | --- | --- | --- |
| 470 | 711.7 | 358.76 | 352.94 |
| 470 | 713 | 360.12 | 352.88 |
| 470 | 717 | 365.2 | 351.8 |
| 500 | 714 | 334.4 | 379.6 |
| 500 | 714 | 334.2 | 379.8 |
| 500 | 717.1 | 338.5 | 378.6 |
| 530 | 713.9 | 308.6 | 405.3 |
| 530 | 714 | 309.7 | 404.3 |
| 530 | 715.8 | 311.5 | 404.3 |

Figure 1:
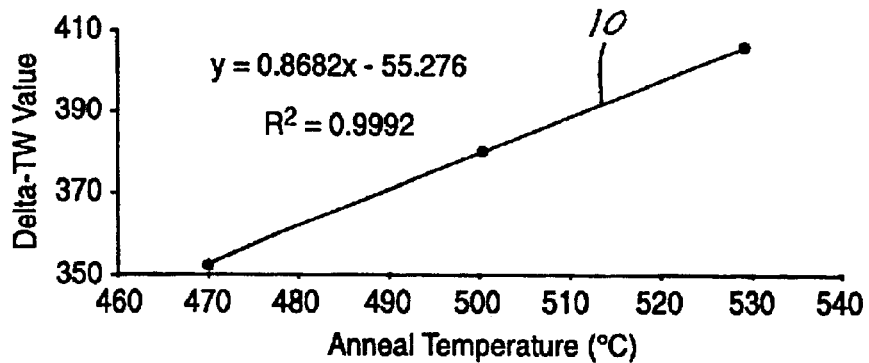
FIG. 1 is a plot of delta thermal wave values measured at 470, 500 and 530° C. anneal temperatures.

The average of the Delta-TW for each of the three annealing temperatures 470° C., 500° C., and 530° C. is plotted as a diamond marker in FIG. 1, and a line 10 drawn through the diamond markers. Based on FIG. 1 it was determined that an ideal Delta-TW for a 500° C. annealing temperature was 379.5.

Figure 2:
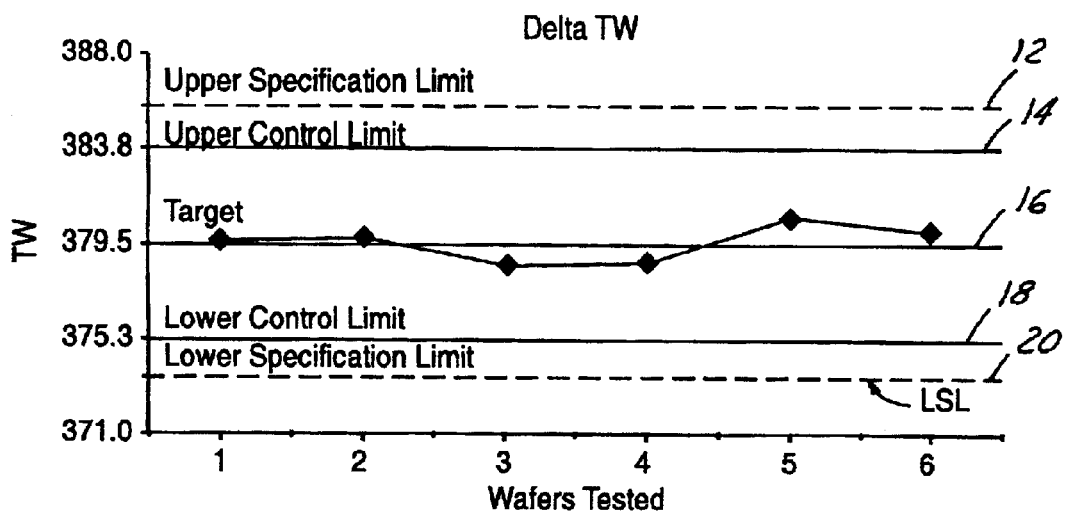
FIG. 2 is a graphic representation of the process control parameters useful in a method according to the present invention.

According to the present invention and as illustrated in FIG. 2, an ideal Delta-TW target 16 is set, for example 379.5 (for 500° C. anneal temperature) for monitoring purposes of ion implantation and annealing processes. An absolute maximum allowable tolerance range is establish for which the Delta-TW may vary from the ideal Delta-TW target 16 and still be with specifications for the acceptable process performance. For example, a maximum allowable specification tolerance of +/−6 TW (~7 C) which defines an upper specification limit shown as dashed line 12, and a lower specification limit shown as dashed line 20. To insure that wafers are within the outer specification limits (lines 12, 20) for Delta-TW, a control target range with the outer specification limits is established. For example, a control target range can be established as +/−4.3 TW (~5 C) of the ideal Delta-TW to define an upper control limit for TW shown as line 14 and a lower control limit for TW shown as line 18. A variation of +/− in the Delta-TW represents a variation of +/−5° C. in the actual temperature of the wafer in the rapid thermal annealing process. When the measured Delta-TW for a wafer is outside of the control target range the wafer is rejected and the operation of the rapid temperature anneal furnace is adjusted to bring the measured Delta-TW of subsequent implanted and annealed wafers back within the control target range. The operation of the rapid temperature anneal furnace may be adjusted in a variety of ways, including, but not limited to, decreasing the rate at which the semiconductor wafer is heated if the Delta-TW is greater than an upper limits of a target range, and increasing the rate at which the semiconductor wafer is heated if the Delta-TW is less than the lower limit of a target range. The operation of the rapid thermal anneal furnace may also be adjusted so that the time period in which the semiconductor wafer is heated is decreased if the Delta-TW is greater than the upper limit of the target range, and the time period may be increased if the Delta-TW is less than the lower limit of the target range. Alternatively, if the Delta-TW for a wafer is outside of the control target range the ion dose level may be adjusted. For example, the ion dose level may be decreased if the Delta-TW is less than the lower limit of the target range, and the ion dose level may be increased if the Delta-TW is greater than the lower limit of the target range.

What is claimed is:

1. A method comprising:
   operating an ion implanter to implant ions in a semiconductor wafer at a first ion dose level;
   performing a first thermal wave measurement to obtain a first thermal wave value;
   placing the semiconductor wafer in a rapid thermal annealing furnace and operating the furnace to rapidly heat the semiconductor wafer at a first rate for a first time period; and
   performing a second thermal wave measurement to obtain a second thermal wave value.

2. A method as set forth in claim 1 further comprising comparing the difference between the first thermal wave value and the second thermal wave value to a target range and if the difference is outside of the target range then adjusting the rate at which the semiconductor wafer is heated.

3. A method as set forth in claim 1 further comprising comparing the difference between the first thermal wave value and the second thermal wave value to a target range having an upper limit and a lower limit, and if the difference is greater than the upper limit then decreasing the rate at which the semiconductor wafer is heated, and if the difference is less than the lower limit of the target range then increasing the rate at which the semiconductor wafer is heated.

4. A method as set forth in claim 1 further comprising comparing the difference between the first thermal wave value and the second thermal wave value to a target range and if the difference is outside of the target range then rejecting the semiconductor wafer as being outside of an acceptable specification.

5. A method as set forth in claim 2 wherein the target range is 376.5–382.5.

6. A method as set forth in claim 4 wherein the target range is 376.5–382.5.

7. A method as set forth in claim 1 further comprising comparing the difference between the first thermal wave value and the second thermal wave value to target range and if the difference is outside of the target range then adjusting the operation of the furnace to supply more or less heat.

8. A method as set forth in claim 1 further comprising comparing the difference between the first thermal wave value and the second thermal wave to a target range having an upper limit and a lower limit, and if the difference is greater than the upper limit then adjusting the operation of the furnace to supply less heat, and if the difference is less than the lower limit then adjusting the operation of the furnace to supply more heat.

9. A method as set forth in claim 1 further comprising comparing the difference between the first thermal wave value and the second thermal wave value to a target range and adjusting the time period that the wafer is heated in response to the comparison.

10. A method as set forth in claim 1 further comprising comparing the difference between the first thermal wave value and the second thermal wave value to a target range having an upper limit and a lower limit, and if the difference is greater than the upper limit then reducing the time period that the wafer is heated, and if the difference is less than the lower limit then increasing the time period that the wafer is heated.

11. A method as set forth in claim 1 further comprising comparing the difference between the first thermal wave value and the second thermal wave value to a target range and adjusting the first ion dose level in response to the comparison.

12. A method as set forth in claim 11 wherein the adjusting of the first ion dose level comprises increasing the ion dose level if the difference is less than the lower limit of the target range, and decreasing the ion dose level if the difference is greater than the lower limit of the target range.

13. A method comprising:
    operating an ion implanter to implant ions in a semiconductor wafer at a first ion dose level;
    performing a first thermal wave measurement to obtain a first thermal wave value;
    placing the semiconductor wafer in a rapid thermal annealing furnace and operating the furnace to rapidly heat the semiconductor wafer at a first rate for a first time period and so that the wafer is heated with the intent of achieving a wafer temperature of 500° C.;
    performing a second thermal wave measurement to obtain a second thermal wave value;
    comparing the difference between the first thermal wave value and the second thermal wave value to a target range of 376.5–382.5 and rejecting the wafer as being outside of an acceptable specification if the difference is outside of the target range.

14. A method as set forth in claim 13 further comprising comparing the difference between the first thermal wave value and the second thermal wave value to target range and if the difference is outside of the target range then adjusting the operation of the furnace to supply more or less heat.

15. A method as set forth in claim 13 further comprising comparing the difference between the first thermal wave value and the second thermal wave to a target range having an upper limit and a lower limit, and if the difference is greater than the upper limit then adjusting the operation of the furnace to supply less heat, and if the difference is less than the lower limit then adjusting the operation of the furnace to supply more heat.

16. A method as set forth in claim 13 further comprising comparing the difference between the first thermal wave value and the second thermal wave value to a target range having an upper limit and a lower limit, and if the difference is greater than the upper limit then reducing the time period that the wafer is heated, and if the difference is less than the lower limit then increasing the time period that the wafer is heated.

17. A method as set forth in claim 13 further comprising comparing the difference between the first thermal wave value and the second thermal wave value to a target range and adjusting the first ion dose level in response to the comparison.

* * * * *